US012782485B2

(12) United States Patent
Borup et al.

(10) Patent No.: US 12,782,485 B2
(45) Date of Patent: Nov. 3, 2026

(54) DETERMINATION OF BO INHOMOGENITY IN MAGNETIC RESONANCE IMAGING

(71) Applicant: KONINKLIJKE PHILIPS N.V., Eindhoven (NL)

(72) Inventors: Daniel Duffy Borup, Best (NL); Elwin De Weerdt, Tilburg (NL); Nicola Pezzotti, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 105 days.

(21) Appl. No.: 18/993,010

(22) PCT Filed: Jul. 5, 2023

(86) PCT No.: PCT/EP2023/068477
§ 371 (c)(1),
(2) Date: Jan. 10, 2025

(87) PCT Pub. No.: WO2024/012947
PCT Pub. Date: Jan. 18, 2024

(65) Prior Publication Data

US 2025/0347762 A1 Nov. 13, 2025

Related U.S. Application Data

(60) Provisional application No. 63/388,384, filed on Jul. 12, 2022.

(30) Foreign Application Priority Data

Jul. 28, 2022 (EP) .................................... 22187466

(51) Int. Cl.
*G01R 33/565* (2006.01)
*G01R 33/24* (2006.01)
*G01R 33/56* (2006.01)

(52) U.S. Cl.
CPC ..... *G01R 33/56563* (2013.01); *G01R 33/243* (2013.01); *G01R 33/5608* (2013.01)

(58) Field of Classification Search
CPC .............. G01R 33/243; G01R 33/5608; G01R 33/56563
See application file for complete search history.

(56) References Cited

U.S. PATENT DOCUMENTS 10,955,508 B2 * 3/2021 Fuderer ............ G01R 33/56536
11,257,191 B2 * 2/2022 Litwiller ................ G06N 20/10
2022/0143425 A1 * 5/2022 Schneider .............. A61B 5/055

FOREIGN PATENT DOCUMENTS

EP 3889634 A1 10/2021
WO 2021197955 A1 10/2021

OTHER PUBLICATIONS

International Search Report and Written Opinion from PCT/EP2023/068477 dated Sep. 14, 2023.

(Continued)

*Primary Examiner* — Gregory H Curran

(57) ABSTRACT

Disclosed herein is a medical system (100, 300) comprising a memory (110) storing machine executable instructions (120) and a convolutional neural network (122) configured for outputting a predetermined number of deblurred magnetic resonance images (126) that are slices of a deblurred magnetic resonance imaging data set in response to receiving a set of partially deblurred magnetic resonance images for each of the slices. The execution of the machine executable instructions causes a computational system (104) to: receive (200) the set of partially deblurred magnetic resonance images; receive (202) the predetermined number of deblurred magnetic resonance images in response to inputting the set of partially deblurred magnetic resonance images for each of the slices into the convolutional neural network; calculate (204) a set of difference images (128) for each of (Continued)

the slices by calculating a difference between the deblurred magnetic resonance image and each of the set of partially deblurred magnetic resonance images; and calculate (206) a determined B0 inhomogeneity map (130) for each of the slices by fitting a smooth manifold to B0 values determined from the set of difference images, the documentation frequency map, and the assigned demodulating frequency for each of the set of difference images.

15 Claims, 8 Drawing Sheets

(56) References Cited

OTHER PUBLICATIONS

Zeng et al "Deep Learning Method for Non-Cartesian Off-resonance Artifact Correction" Proceedings of the International Society for Magnetic Resonance in Medicine, Ismrm, Joint Annual Meeting ISMRM-ESMRMB, Paris, France, Jun. 16-21, 2018, No. 428, Jun. 1, 2018 (Jun. 1, 2018).

Melissa Haskell et al: "FieldMapNet MRI: Learning-based mapping from single echo time BOLD fMRI data to fieldmaps with model-based image reconstruction", Proceedings of the Joint Annual Meeting ISMRM-ESMRMB 2022 & ISMRT Annual Meeting, London, UK, May 7-12, 2022, ISMRM, 2030 Addison Street, 7th Floor, Berkeley, CA 94704 USA, No. 235, Apr. 22, 2022.

Quan Dou et al "Automatic Off-Resonance Correction for Spiral Imaging with a Convolutional Neural Network", Proceedings of the Joint Annual Meeting ISMRM-ESMRMB 2022 & ISMRT Annual Meeting, London, UK, May 7-12, 2022, ISMRM, 2030 Addison Street, 7th Floor, Berkeley, CA 94704 USA, No. 5022, Apr. 22, 2022.

Noll et al "Deblurring for Non-2D Fourier Transform Magnetic Resonance Imaging", Magnetic Resonance in Medicine, Wiley-Liss, US, vol. 25, No. 2, Jun. 1, 1992 (Jun. 1, 1992), pp. 319-333.

Lim et al "Deblurring for Spiral Real-Time MRI Using Convolutional Neural Networks" ISMRM.

* cited by examiner

DETERMINATION OF BO INHOMOGENITY IN MAGNETIC RESONANCE IMAGING

CROSS REFERENCE TO RELATED APPLICATIONS

This application is a U.S. national phase application of International Application No. PCT/EP2023/068477 filed on Jul. 5, 2023, which claims the benefit of U.S. Application Ser. No. 63/388,384 filed on Jul. 12, 2022 and EP Application Serial No. 22187466.2 filed on Jul. 28, 2022, each of which is incorporated herein by reference.

FIELD OF THE INVENTION

The invention relates to Magnetic Resonance Imaging, in particular to determination of the B0 inhomogeneity.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the BO field or the main magnetic field. The strength of the BO field, and any applied gradient magnetic fields, determine the frequency at which spins (typically protons in a Hydrogen nuclei) process. Inhomogeneities in the BO field can result in protons precessing at a different frequency than desired. The protons or other spins are then resonating off frequency. A BO field inhomogeneity map or equivalently a frequency off-resonance mapping can be measured and used to make corrections during the reconstruction of the magnetic resonance image. There may be several difficulties. In some cases, an BO inhomogeneity map may not be available or may be invalid, for example if the subject shifted position or moved.

International patent application WO 2021/197955 discloses a medical system comprising a memory storing machine executable instructions and a trained neural network. The trained neural network is configured to output corrected magnetic resonance image data in response to receiving as input a set of magnetic resonance images each having a different spatially constant frequency off-resonance factor. The medical system further comprises a computational system configured for controlling the medical system, wherein execution of the machine executable instructions causes the computational system to: receive k-space data acquired according to a magnetic resonance imaging protocol; reconstruct a set of magnetic resonance images according to the magnetic resonance imaging protocol, wherein each of the set of magnetic resonance images is reconstructed assuming a different spatially constant frequency off-resonance factor chosen from a list of frequency off-resonance factors; and receive the corrected magnetic resonance image data in response to inputting the set of magnetic resonance images into the trained neural network.

SUMMARY OF THE INVENTION

The invention provides for a medical system, a computer program, and a method in the independent claims. Embodiments are given in the dependent claims.

The use of neural networks to determine B0 inhomogeneity maps or correction for B0 inhomogeneity is known. A difficulty is that neural networks are susceptible to out of distribution (OOD) errors or can sometimes provide erroneous data such as so-called "neural hallucinations." This may be problematic for medical imaging because errors caused by neural networks can result in misleading or incorrect medical images. Embodiments may provide for an improved means of estimating a B0 inhomogeneity map that may have a reduced likely hood of having an error. This is explained in the context of a single two-dimensional magnetic resonance image or slice. The below explanation can be extended to three-dimensional data sets comprising multiple slices.

To accurately estimate the B0 inhomogeneity map (for a single slice or image), a set of partially deblurred magnetic resonance images that have had different demodulating frequencies applied to a single magnetic resonance image is provided. These varying demodulating frequencies have the effect of deblurring the single magnetic resonance image when the demodulating frequency is correct. A convolutional neural network constructs a deblurred magnetic resonance image from the set of partially deblurred magnetic resonance images. After this, difference images are calculated by subtracting the deblurred magnetic resonance image from each of the partially deblurred magnetic resonance images or vice versa. The difference images can then be used to determine algorithmically where and which of the partially deblurred magnetic resonance images provides the correct demodulation frequency. Instead of taking this directly, the B0 inhomogeneity values are determined by fitting a smooth manifold (or smooth surface) to data derived from the set of difference images and a demodulation frequency map and assigned demodulating frequency for each of the difference images. The fitting of a smooth surface or manifold has the effect of reducing or eliminating errors caused by the neural network not correctly providing the deblurred magnetic resonance image.

The concept of the partially deblurred image in the framework of the present invention pertains to a version of the magnetic resonance image for a specific slice that is associated with a demodulation frequency value specified by the demodulation frequency map for the slice. The demodulation frequency is associated with the demodulation of the acquired magnetic resonance signals (k-space data) that have the Larmor frequency as its radio frequency carrier frequency. This demodulation may be done prior to reconstruction of the magnetic resonance image from the k-pace data Each partially deblurred image has one or more portions or patches that are correctly deblurred, viz. in these portions or patches the value of the demodulation frequency matches that actual spatial main magnetic field strength that may be spatial inhomogeneous (and that is associated with the local (Larmor) radio frequency carrier frequency. For each slice the demodulation frequency map represents spatially dependent values of the demodulation frequency over the area of the image. The slice-specific demodulation frequency map could be set to a constant, i.e., be a flat uniform map. The demodulation frequency map may vary from slice to slice in that per slice the demodulation frequency map is offset by a slice-specific offset value.

In one aspect the invention provides for a medical system that comprises a memory storing machine-executable instructions and a convolutional neural network that is configured for outputting a predetermined number of deblurred magnetic resonance images that are slices of a deblurred magnetic resonance imaging dataset in response to receiving a set of partially deblurred magnetic resonance images for each of the slices.

In magnetic resonance imaging there can be so called off-resonance blurring. The deblurred magnetic resonance imaging dataset is either a single slice or a stack of slices that form a three-dimensional magnetic resonance imaging dataset. The off-resonance blurring in magnetic resonance imaging is caused by a lack of knowledge of the actual B0 magnetic field during an imaging procedure. A baseline B0 magnetic field can be measured for a magnetic resonance imaging system and this can be used for compensating or deblurring a magnetic resonance image. A difficulty with this is that for a particular magnetic resonance imaging protocol the gradient magnetic fields may cause eddy currents within various locations of the magnetic resonance imaging scanner or magnet. As these eddy currents may vary with particular magnetic resonance imaging protocols it can be very challenging to compensate for these B0 field inhomogeneities. The approach taken in this example is to provide a set of partially deblurred magnetic resonance images for each slice of the measured magnetic resonance imaging dataset. Each of these images can be prepared by assuming a particular B0 inhomogeneity. The result of doing this process is that the original magnetic resonance imaging slice may have certain regions of it blurred or deblurred depending upon whether the assumptions about the B0 magnetic field are correct or incorrect. The convolutional neural network is able to receive a set of partially deblurred magnetic resonance images and from this construct an image that is deblurred. Essentially it is a composite of the set of partially deblurred magnetic resonance images. There may be several variations on this.

In one example the convolutional neural network only acts on a single set at one time. This would be equivalent to deblurring just a single slice or two-dimensional dataset of the measured magnetic resonance imaging dataset. In this case the predetermined number of deblurred magnetic resonance images is simply one. For a three-dimensional magnetic resonance imaging dataset comprised of multiple slices there is a deblurred magnetic resonance image that is provided for each of the slices. This means that there is a set of partially deblurred magnetic resonance images that is provided for each slice and the neural network is able to produce a deblurred image for each of the sets. This may have several advantages over processing a single slice at a time. For example, the convolutional neural network can be trained to receive all of this data at the same time and then data from adjacent slices essentially is used to aid in deblurring each individual slice. If the anatomy of say a brain or other anatomical structure varies from slice-to-slice but there are similarities within the various slices, the properly trained convolutional neural network can use this data and it may provide superior deblurring over doing a single slice at a time.

Using a convolutional neural network that accepts a single slice may have advantages in that it may be easier or more straightforward to train. For example, if just a single slice is processed it may not be necessary to even use medical imaging data for training it. For example, a normal optical image from a camera could be taken and then various portions of this image are blurred. This can be used as the training data and it can be much simpler to provide this version of the convolutional neural network.

The medical system further comprises a computational system. The computational system as used herein may take several different forms. In one case it may be a remote or a virtual computing system that is for example provided as a cloud service. In other examples the computational system may be a workstation or computer located in a radiology or other medical facility. In yet other examples, the computational system may be part of the computer or control system for a magnetic resonance imaging system. Execution of the machine-executable instructions causes the computational system to receive the set of partially deblurred magnetic resonance images for each of the slices. Each of the set of partially deblurred magnetic resonance images has an assigned demodulating frequency specifying an offset of a slice-specific demodulation frequency map. So in this feature the offset is a demodulating frequency offset and the slice-specific demodulation frequency map is an assumption about the demodulation frequency that could be correct. For example, a measurement of the B0 inhomogeneity that was previously measured may give a good estimate or starting point for determining the B0 inhomogeneity for a specific pulse sequence or certain activation sequence of the magnetic resonance imaging system's gradient coil system. The B0 inhomogeneity would of course vary spatially, so in this way you would make the slice-specific demodulation frequency map by slicing up this existing or premeasured B0 inhomogeneity map. The offset could then be used to move this slice-specific demodulation frequency map by intervals of demodulation frequency.

In some cases, there may not be a prior knowledge of the B0 inhomogeneity or it may be better not to make assumptions about this. In this case, the slice-specific demodulation frequency map could be set to a constant or near a null value for all slices. In this case, then the assigned demodulation frequency for each individual partially deblurred magnetic resonance image is then simply specified by the offset value. In this example, then each of the set of partially deblurred magnetic resonance images has an assigned modulation frequency specifying a single offset demodulation frequency or value.

Execution of the machine-executable instructions further causes the computational system to receive the predetermined number of deblurred magnetic resonance images in response to inputting the set of partially deblurred magnetic resonance images for each of the slices into the convolutional neural network. In this step, the set of partially deblurred magnetic resonance images for each slice is input into the neural network simultaneously and in response the predetermined number of deblurred magnetic resonance images is received as output.

Execution of the machine-executable instructions further causes the computational system to calculate a set of difference images for each of the slices by calculating a difference between the deblurred magnetic resonance image and each of the set of partially deblurred magnetic resonance images. This difference may be calculated by performing pixel wise subtraction. This process is repeated for each of the slices. Execution of the machine-executable instructions further causes the computational system to calculate a determined B0 inhomogeneity map for each of the slices by fitting a smooth manifold to values determined from the set of difference images, the demodulation frequency map and the assigned demodulation frequency for each of the set of difference images.

Essentially the set of difference images provides information on which of the partially deblurred magnetic resonance images correctly deblurred the deblurred magnetic resonance imaging data in a particular slice. Knowing this and then knowing the slice-specific demodulation frequency map and the assigned demodulation frequency enables one to know the particular value of the B0 inhomogeneity map for these regions.

The fitting of the smooth manifold provides a very effective means of accurately determining the B0 inhomogeneity map. A difficulty in using convolutional neural networks with medical imaging processing is that the convolutional neural network may provide hallucinations or erroneous data. For example, particular voxels may provide a bad value or regions may be partially incorrect. If one were to use a convolutional neural network one could train it to directly output the determined B0 inhomogeneity map for each of the slices correctly. However, one would not have a good way of detecting or correcting for errors. The technique detailed above is extremely robust and the subtraction of the set of difference images and the fitting of the smooth manifold automatically removes minor imperfections or inaccuracies in the determined B0 inhomogeneity map for each of the slices. If there is only a single slice then the smooth manifold may be a smooth surface. If there is a stack of slices, then the manifold may be a function which varies smoothly in three-dimensional space.

The smooth manifold can be fit in a variety of ways. In one example, the smooth manifold is fit to the difference values in the set of difference images directly so that spans the space where the difference images are the smallest. A knowledge of the demodulation frequency map and the assigned demodulating frequency for each of the set of difference images then allows calculation of the determined B0 inhomogeneity map from the manifold. Alternatively, on a pixel by pixel basis a demodulating frequency can be selected or interpolated for each pixel using the set of difference images. The smooth manifold can be fit to these demodulating frequency values or a B0 inhomogeneity map calculated from the demodulating frequency values. In all of these examples the smooth manifold may be used to smooth out discontinuities and/or smooth over potential errors.

In one example, the fitting of the smooth manifold is solved as an optimization problem where the values of the set of difference images are minimized along the manifold, with the manifold subject to constraints such as smoothness and a maximum slope that are known from physical knowledge of B0 map characteristics. For example, a template representing a typical or prior B0 map may be used.

The convolutional neural network may for example be implemented as a U-net. To implement the U-net to receive the set of partially deblurred magnetic resonance images for each slice the number of input or encoding branches can be increased to have an input branch or encoding input for each image in the set of partially deblurred magnetic resonance images x the number of slices. Likewise, the output can be increased so that there is an output layer or branch for every individual slice. There can be skip connections between the various output or encoding branches of the U-net to share data between them so essentially a conventional U-net architecture can be expanded to provide for the convolutional neural network. An alternative to using a U-net would be a RESNET that has had its number of inputs and outputs expanded.

The training of the convolutional neural network can be performed in several different ways. If there are multiple slices, then likely the optimal way is to take a magnetic resonance imaging dataset that does not have any blurring that is visible and then to artificially provide the set of partially deblurred magnetic resonance images for each of the slices. This could be for example performed by applying a blurring kernel to part of the image in different varying spatial patterns; it could also be achieved by taking the original k-space data and then artificially resampling the data using a simulated B0 inhomogeneity map. In any case, one has a set of blurred images and one has the original image either in two-dimensional slice or a full three-dimensional dataset formed from a stack of two-dimensional slices that one can use as ground truth data. One inputs the artificially blurred samples into the convolutional neural network and then compares it to the original unblurred image and may use a deep learning algorithm for training the neural network. In the case of a convolutional neural network that acts on only a single slice, the training data may be much broader, for example, one could use a variety of photographic images to train the convolutional neural network. In this example one would take a photograph and then produce the set of partially deblurred magnetic resonance images by locally blurring different regions of this original photographic. A large advantage of this is that a huge amount of training data is available with variable work.

In another embodiment execution of the machine-executable instructions further causes the computational system to determine the modulation frequency for each voxel of the deblurred magnetic resonance image for each of the slices using the set of partially deblurred magnetic resonance images, the assigned modulation frequency for each of the set of difference images, and the demodulation frequency map. The B0 inhomogeneity values are determined from the demodulation frequency for each voxel. In this embodiment the demodulation frequency for each voxel is determined individually. The deblurred magnetic resonance images can be used to select a value or for example, a curve can be fit to all of the values for a particular voxel using all of the available images and a best value can be interpolated. However, one notes that the specific value of the demodulation frequency is not used directly; the smooth manifold is still used. As was mentioned previously, this helps to reduce the effect of errors and accuracies caused by using a convolutional neural network. This is very beneficial for producing medical images because it reduces the likelihood of out of distribution errors as well as hallucinations caused by the convolutional neural network.

In another embodiment voxels of the deblurred magnetic resonance image having a magnitude below a predetermined magnitude or a magnitude below a predetermined tolerance within at least a continuous predetermined volume are ignored or deemphasized during fitting of the smooth manifold. If one looks at a magnetic resonance image one notices that there are regions of the image where the voxels have a very low value; for example, a magnetic resonance image which is proton weighted illustrates the volume of hydrogen protons or water in a spatially varying manner.

Outside the body of the subject or where bone is located this signal will be zero or a very low value. Because the signal is constantly low it is not beneficial to try to fit the manifold to this position. Likewise, regions of an image or magnetic resonance image may have constant values or values which vary by a certain noise level. If this is the case, then inhomogeneities in the B0 field may also not show up. So in this case, if the voxels have a predetermined magnitude range which means that they vary by a certain amount within the continuous predetermined volume, which means a volume or area of at least a certain space are present, then this area is also ignored or deemphasized during the fitting. This also helps to provide for a more accurate estimate of the determined B0 inhomogeneity map.

In another embodiment execution of the machine-executable instructions further causes the computational system to receive a single magnetic resonance image for each of the slices. Execution of the machine-executable instructions further causes the computational system to calculate the set of partially deblurred magnetic resonance images for each slice by applying an off-resonance demodulation determined by the demodulation frequency map and the assigned demodulating frequency. For each of these images that is calculated the demodulation frequency that is used on a voxel-by-voxel basis is determined using the demodulation frequency map and a particular value of the assigned demodulation frequency. The assigned demodulation frequency may be chosen from a demodulation frequency set where each member of the demodulation frequency set corresponds to one of the set of partially deblurred magnetic resonance images.

The off-resonance demodulation may be applied either in image space or in k-space, for example using a demodulating kernel. The demodulating kernel may be the Fourier Transform of the phase modulation map in k-space. A demodulation in k-space or image space are mathematically identical and can take place in either image or k-space, but what's applied is slightly different. In image space, it is convolution with the "blurring kernel" (or "deblurring kernel"). In k-space, it is just pointwise multiplication with a phasor (frequency*time each point was acquired).

Execution of the machine-executable instructions further causes the computational system to receive measured k-space data. The measured k-space data has a spiral sampling pattern or a non-Cartesian sampling pattern. Execution of the machine-executable instructions further causes the computational system to reconstruct the single magnetic resonance image for each of the slices of the measured k-space data. This embodiment may be beneficial because the above-described technique of calculating the determined B0 inhomogeneity map is particularly beneficial when one has a spiral sampling pattern or a non-Cartesian sampling pattern.

In another embodiment the medical system further comprises a magnetic resonance imaging system. The memory further contains pulse sequence commands configured to control the magnetic resonance imaging system to acquire the measured k-space data according to a magnetic resonance imaging protocol. For example, the magnetic resonance imaging protocol may use a spiral sampling pattern or a non-Cartesian sampling pattern in some examples. Execution of the machine-executable instructions further causes the computational system to acquire the measured k-space data by controlling the magnetic resonance imaging system with the pulse sequence commands.

In another embodiment the single magnetic resonance image for each slice is further reconstructed using a prior B0 inhomogeneity map. Execution of the machine-executable instructions further causes the computational system to calculate a corrected B0 inhomogeneity map by modifying the prior B0 inhomogeneity map with the determined B0 inhomogeneity map. In this example, the single magnetic resonance image for each of the slices is initially corrected using the prior B0 inhomogeneity map. So in this case, some of the off-resonance blurring should be at least partially corrected for. At the end of the procedure the corrected B0 inhomogeneity map is calculated by modifying the prior B0 inhomogeneity map with the determined B0 inhomogeneity map. This for example may be beneficial because for a particular set of pulse sequence commands the eddy currents from acquisition-to-acquisition may likely be similar. The corrected B0 inhomogeneity map could for example be used for acquisitions using those particular pulse sequence commands.

In another embodiment execution of the machine-executable instructions further causes the computational system to calculate a corrected magnetic resonance image using the measured k-space data and the corrected B0 inhomogeneity map. In this example the corrected B0 inhomogeneity map is then used to recalculate the corrected magnetic resonance image using the corrected B0 inhomogeneity map. There are a variety of ways in which one could go through and calculate a corrected magnetic resonance image. In this one, one goes back to the original k-space data and uses the corrected B0 inhomogeneity map. This embodiment may be beneficial because it may provide for a more accurate and potentially less blurred magnetic resonance image. The corrected magnetic resonance image in this example may for example be a single slice or it may be a stack of slices if the dataset is a three-dimensional dataset.

In another embodiment execution of the machine-executable instructions further causes the computational system to acquire additional k-space data by controlling the magnetic resonance imaging system with the pulse sequence commands. Execution of the machine-executable instructions further causes the computational system to reconstruct an additional magnetic resonance image for each slice using the additional k-space data. The reconstruction of the additional magnetic resonance image is corrected using the corrected B0 inhomogeneity map. In this example, the pulse sequence commands are the same pulse sequence commands which were used during the process of determining the corrected B0 inhomogeneity map. It is very likely that any eddy currents caused by the gradients would be similar in different acquisitions. This is likely very true if it's the same acquisition for the same individual in the same position, but even if the individual has changed the eddy currents would likely still be very close. This may provide a means for determining the correct B0 inhomogeneity map for a particular magnetic resonance imaging pulse sequence commands.

In another embodiment execution of the machine-executable instructions further causes the computational system to determine a spatially varying demodulation frequency using the determined B0 inhomogeneity map. Execution of the machine-executable instructions further causes the computational system to calculate a corrected magnetic resonance image for each slice by demodulating the single magnetic resonance image with an off-resonance demodulation that uses the spatially varying demodulation frequency. This may for example be performed either in k-space or within image space. As was mentioned previously above, an off-resonance demodulation may be applied either in image space or in k-space, for example using a demodulating kernel.

In another embodiment the corrected magnetic resonance image for each slice is a motion corrected magnetic resonance image.

In another embodiment the corrected magnetic resonance image is a cyclical cardiac magnetic resonance image.

In another embodiment the corrected magnetic resonance image is a breathing phase resolved magnetic resonance image.

In another embodiment the corrected magnetic resonance image is a diffusion weighted magnetic resonance image.

In another embodiment the corrected magnetic resonance image is a diffusion tensor weighted magnetic resonance image.

In another embodiment the corrected magnetic resonance image is an arterial spin labeled magnetic resonance image.

The above-mentioned image types may benefit from the corrected B0 inhomogeneity using the determined B0 inhomogeneity map because these techniques are particularly sensitive to errors in B0 inhomogeneity.

In another embodiment the predetermined number of deblurred magnetic resonance images is one. In this case there is only a single set of partially deblurred magnetic resonance images and there is only one slice.

In another embodiment the demodulation frequency map has a constant value. This may for example be a constant numerical value which may for example be zero. In this case then the set of partially deblurred magnetic resonance images are constructed such that only a single demodulating frequency is applied to the whole image. This may for example be beneficial when a preliminary measurement of the B0 inhomogeneity is not available or one does not want to make assumptions about its inhomogeneity.

In another embodiment the single magnetic resonance image, the deblurred magnetic resonance image, and the set of partially deblurred magnetic resonance images are three-dimensional or two-dimensional. In the case where they are three-dimensional, as was mentioned before, this would imply that there is a stack of slices. If the set of partially deblurred magnetic resonance images are only two-dimensional, this means that there is just one single set and that there is only a single magnetic resonance image which is two-dimensional and which is then deblurred.

In another aspect the invention provides for a computer program or a computer program product comprising machine-executable instructions for execution by a computational system that is controlling a medical system. The computer program product may for example be stored on a non-transitory storage medium. Execution of the machine-executable instructions causes the computational system to receive a set of partially deblurred magnetic resonance images for each of the slices. Each of the set of partially deblurred magnetic resonance images has an assigned demodulated frequency specifying an offset and a slice-specific demodulation frequency map. This specified or assigned demodulating frequency may be spatially varying within each of the partially deblurred magnetic resonance images.

Execution of the machine-executable instructions further causes the computational system to receive a predetermined number of deblurred magnetic resonance images in response to inputting the set of partially deblurred magnetic resonance images for each of the slices into a convolutional neural network. The convolutional neural network is configured for outputting the predetermined number of deblurred magnetic resonance images that are slices of a deblurred magnetic resonance image dataset in response to receiving the set of partially deblurred magnetic resonance images for each of the slices. Execution of the machine-executable instructions further causes the computational system to calculate a set of difference images for each of the slices by subtracting the deblurred magnetic resonance image from each of the set of partially deblurred magnetic resonance images or vice versa. Execution of the machine-executable instructions further causes the computational system to calculate a determined B0 inhomogeneity map for each of the slices by fitting a smooth manifold to values determined from the set of difference images, for the modulation frequency map, and the assigned demodulating frequency for each of the set of difference images.

In another aspect the invention provides for a method of medical imaging. The method comprises receiving a set of partially deblurred magnetic resonance images for each of a number of slices. The number of slices is referred to as 'the slices' herein. Each of the set of partially deblurred magnetic resonance images has an assigned demodulating frequency specifying an offset of a slice-specific demodulation frequency map. The method further comprises receiving a predetermined number of deblurred magnetic resonance images in response to inputting the set of partially deblurred magnetic resonance images for each of the slices into a convolutional neural network. The convolutional neural network is configured for outputting a predetermined number of deblurred magnetic resonance images that are the slices of a deblurred magnetic resonance imaging dataset in response to receiving the set of partially deblurred magnetic resonance images for each of the slices.

The method further comprises calculating a set of difference images for each of the slices by calculating a difference between the deblurred magnetic resonance image and each of the set of partially deblurred magnetic resonance images. The method further comprises calculating a determined B0 inhomogeneity map for each of the slices by fitting a smooth manifold to values determined from the set of difference images, the demodulation frequency map, and the assigned demodulating frequency for each of the set of difference images.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general-purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF EMBODIMENTS

Like numbered elements in these figures are either equivalent elements or perform the same function. Elements which have been discussed previously will not necessarily be discussed in later figures if the function is equivalent.

Figure 1:
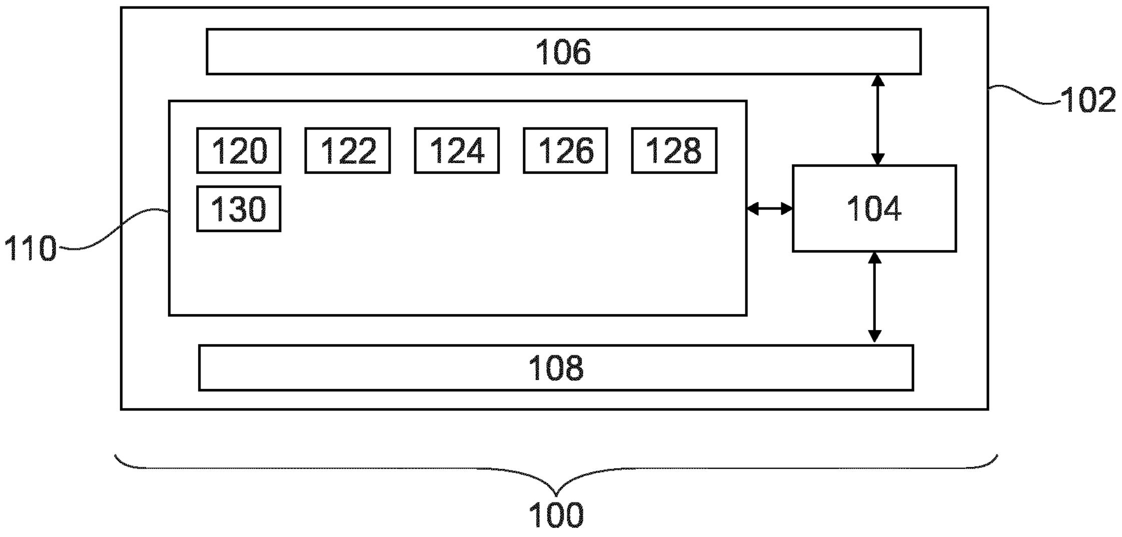
FIG. 1 illustrates an example of a medical instrument.

FIG. 1 illustrates an example of a medical system 100. The medical system 100 in this example is shown as comprising a computer 102 with a computational system 104. The computer 102 is intended to represent one or more computing devices that may be in the same location or may be distributed. The computational system 104 is intended to represent one or more computational systems such as one or more processors and/or processing cores. The various computational systems 104 may also be located at the same or at different locations. The medical system 100 in this example is intended to represent a variety of configurations, for example the medical system 100 may be a remote computer in a cloud computing or other network accessible computing system.

In other examples, the medical system 100 could for example be located in a hospital or radiology department. In other examples the medical system 100 may be incorporated into a magnetic resonance imaging system. The computer 102 is shown as containing a hardware interface 106. The hardware interface may for example enable the computational system 104 to communicate and control other components of a medical system 100, for example, if it additionally comprises a magnetic resonance imaging system. The hardware interface 106 may also represent network connections that may enable the computational system 104 to function at a remote location. The computer 102 is further shown as optionally comprising a user interface 108 that may for example enable a user to operate and/or control the medical system 100. The computer 102 is further shown as comprising a memory 110 that is in communication with the computational system 104. The memory 110 is intended to represent various types of memory such as a non-transitory storage medium as well as volatile or non-volatile memories that are accessible to the computational system 104.

The memory 110 is shown as containing machine-executable instructions 120. The machine-executable instructions 120 enable the computational system 104 to perform various data processing and control tasks. For example, it may enable the computational system 104 to reconstruct magnetic resonance images from k-space data as well as perform various other data manipulation and image processing tasks. The memory 110 is further shown as containing a convolutional neural network 122. The convolutional neural network 122 is configured to output a predetermined number of deblurred magnetic resonance images that are slices of a deblurred magnetic resonance imaging dataset in response to receiving a set of partially deblurred magnetic resonance images for each of the slices. The deblurred magnetic resonance imaging dataset may for example be a single slice in which case the deblurred magnetic resonance imaging dataset is a two-dimensional magnetic resonance image. In other cases, the deblurred magnetic resonance imaging dataset may be a stack of slices that form a three-dimensional magnetic resonance imaging dataset or image.

The memory 110 is further shown as containing a set of partially deblurred magnetic resonance images for each slice. The memory is further shown as containing the predetermined number of deblurred magnetic resonance images 126 that were received from the convolutional neural network 122 by inputting the set of partially deblurred magnetic resonance images for each slice 124 into it. The memory 110 is further shown as containing a set of difference images for each of the slices 128. The memory 110 is further shown as containing a determined B0 inhomogeneity map for each slice 130.

Figure 2:
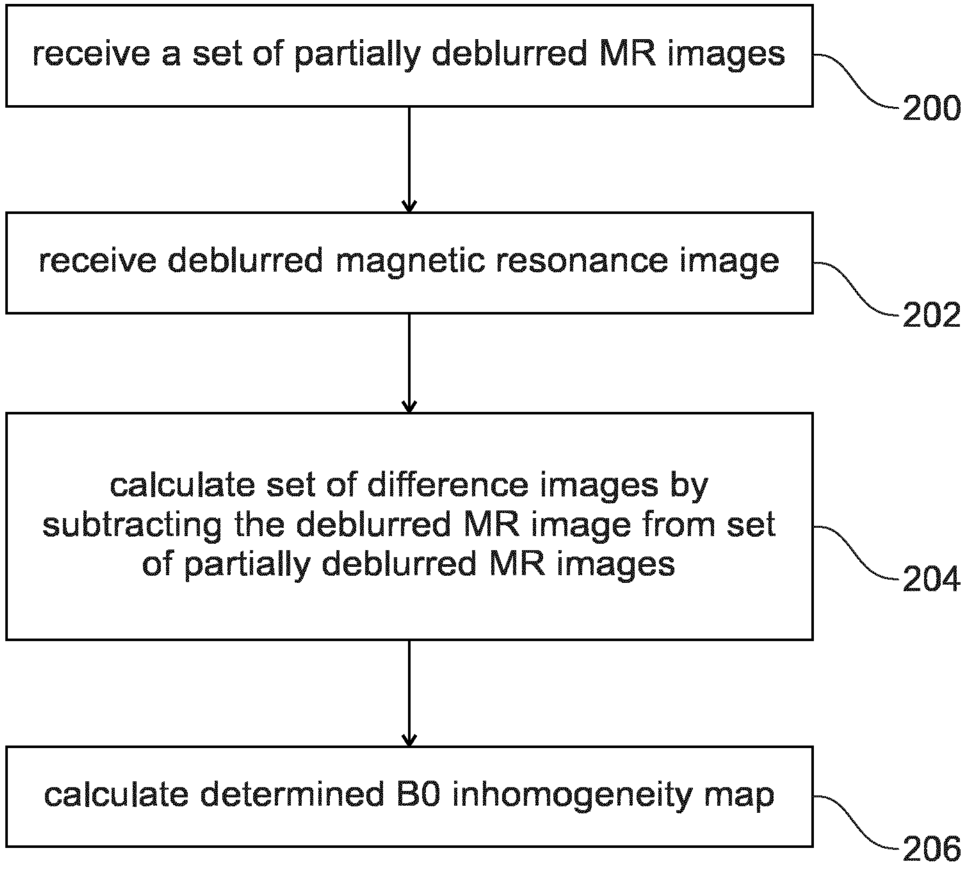
FIG. 2 shows a flow chart which illustrates a method of using the medical instrument of FIG. 1.

FIG. 2 shows a flowchart which illustrates a method of operating the medical system 100 of FIG. 1. First, the set of partially deblurred magnetic resonance images for each slice 124 is received. Each of the set of partially deblurred magnetic resonance images 124 has an assigned demodulating frequency specifying an offset of a slice-specific demodulation frequency map. Next, in step 202, the predetermined number of deblurred magnetic resonance images 126 is received in response to inputting the set of partially deblurred magnetic resonance images 124 for each slice into the convolutional neural network 122. Then, in step 204, a set of difference images 128 is calculated for each of the slices by subtracting the deblurred magnetic resonance image from each of the set of partially deblurred magnetic resonance images pixel by pixel, or vice versa. Finally, in step 206, the determined B0 inhomogeneity map 130 for each slice is calculated by fitting a smooth manifold to values determined from the set of difference images, the demodulation frequency map, and the assigned demodulation frequency for each of the set of difference images.

Figure 3:
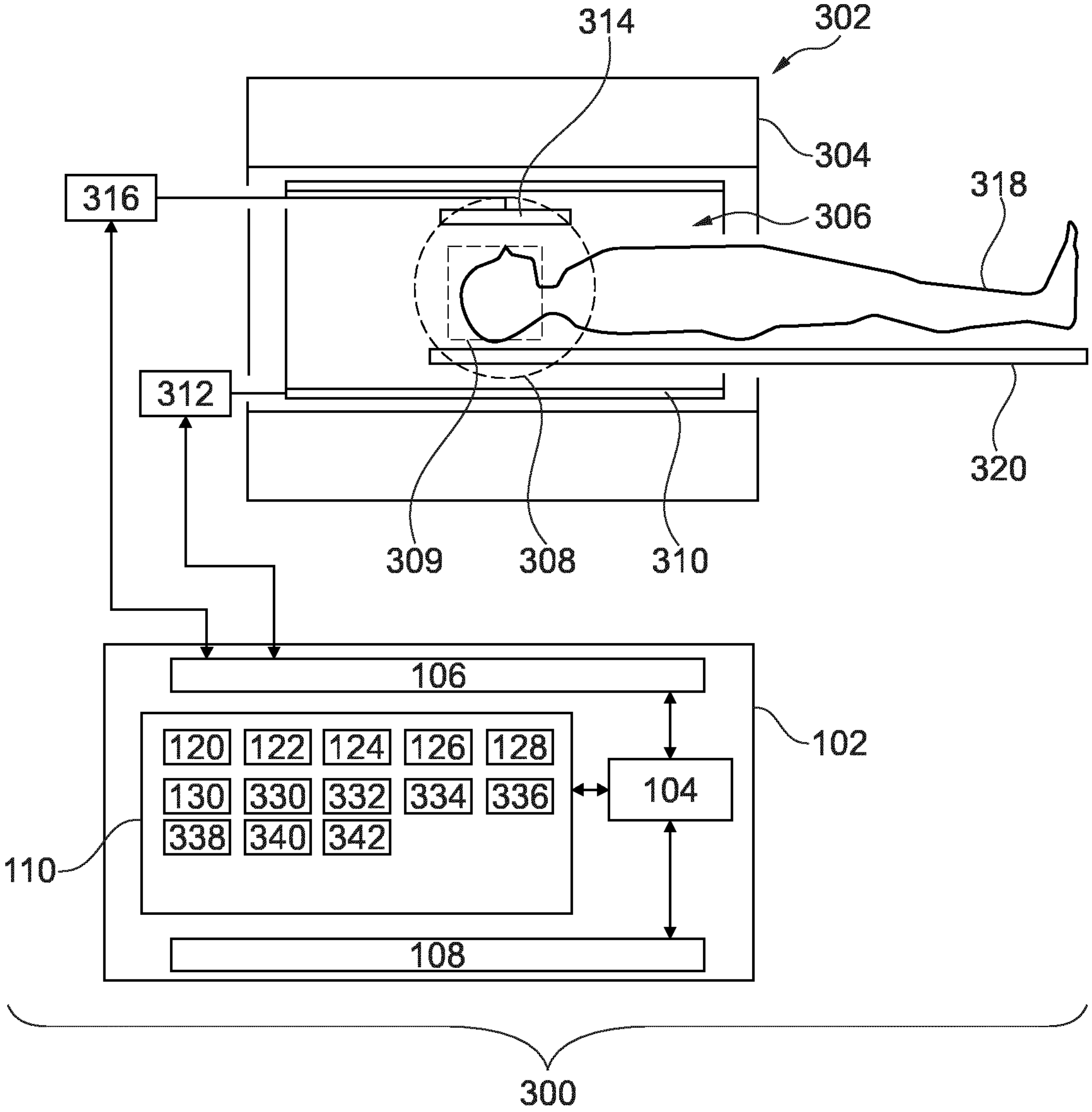
FIG. 3 illustrates an example of a medical instrument.

FIG. 3 illustrates a further example of a medical system 300. The medical system 300 depicted in FIG. 3 is similar to the medical system 100 of FIG. 1 except that it additionally comprises a magnetic resonance imaging system 302 that is controlled by the computational system 104.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A field of view 309 is shown within the imaging zone 308. The k-space data that is acquired typically acquired for the field of view 309. The region of interest could be identical with the field of view 309 or it could be a sub volume of the field of view 309. A subject 318 is shown as being supported by a subject support 320 such that at least a portion of the subject 318 is within the imaging zone 308 and the field of view 309.

Within the bore 306 of the magnet there is also a set of magnetic field gradient coils 310 which is used for acquisition of preliminary k-space data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels.

The transceiver 316 and the gradient controller 312 are shown as being connected to the hardware interface 106 of the computer system 102.

The memory 110 is further shown as containing pulse sequence commands 330. The pulse sequence commands are either commands or data which may be converted into commands which enable the computational system 104 to control the magnetic resonance imaging system 302 to acquire k-space data. The memory 110 is further shown as containing measured k-space data 332 that was acquired by the magnetic resonance imaging 302 and controlling it with the pulse sequence commands 330. The memory 110 is further shown as containing a single magnetic resonance image for each of the slices 334 that were reconstructed from the measured k-space data 332. The memory 110 is further shown as containing a prior B0 inhomogeneity map 336 that was measured. The memory 110 is further shown as containing a corrected B0 inhomogeneity map 338 that was calculated from the prior B0 inhomogeneity map 336 and the determined B0 inhomogeneity map for each slice 130. It is understood that references to the B0 inhomogeneity map and/or the corrected B0 inhomogeneity map 338 may refer to individual slices or the inhomogeneity maps as a whole. The memory 110 is further shown as containing additional k-space data 340 that was also acquired by controlling the magnetic resonance imaging system 302 with the pulse sequence commands 330. The memory 110 is further shown as containing an additional magnetic resonance image for each of the slices 342 that was reconstructed from the additional k-space data 340 and the corrected B0 inhomogeneity map 338. This may for example be a slice-specific corrected B0 inhomogeneity map 338.

Figure 4:
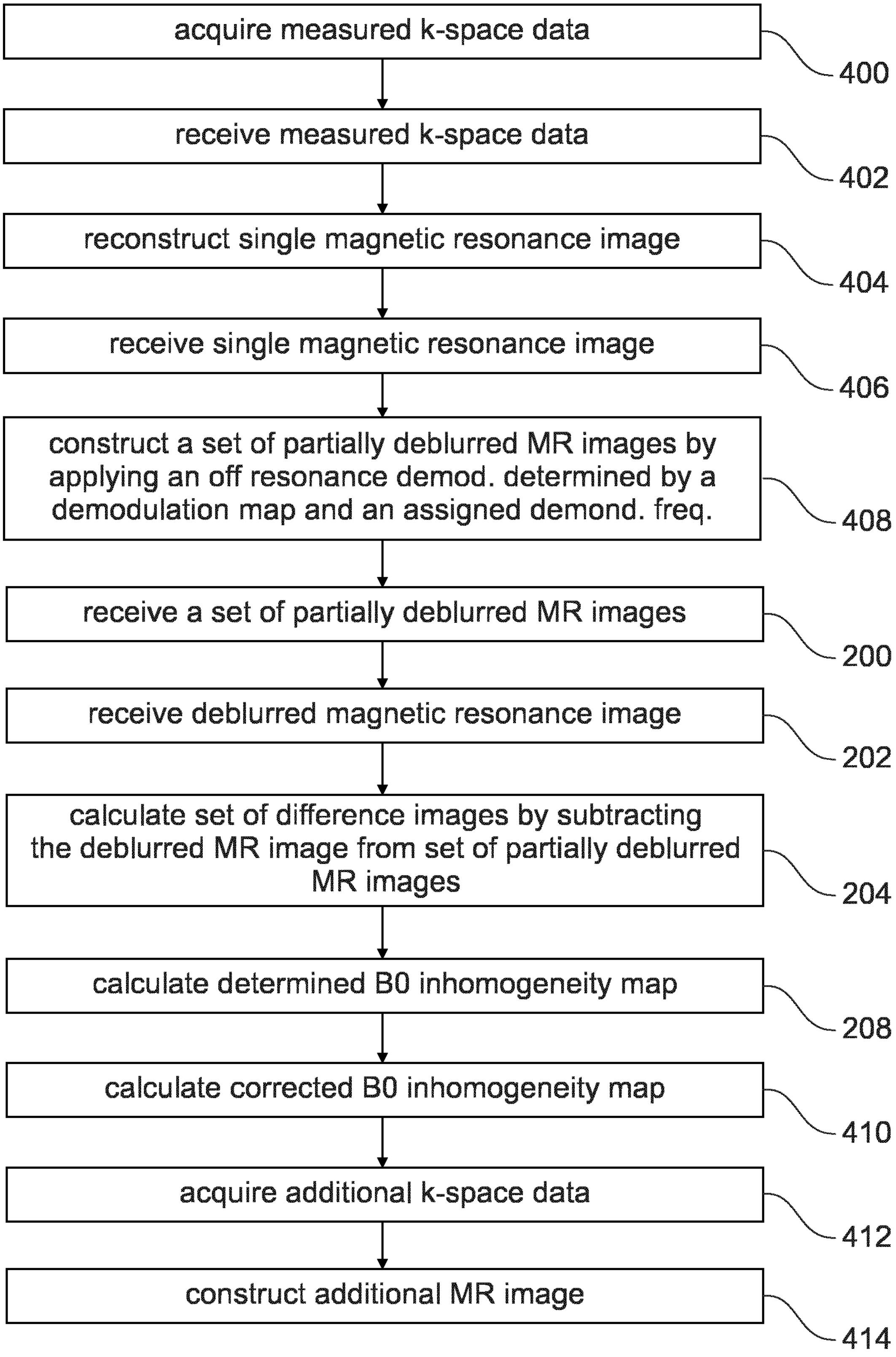
FIG. 4 shows a flow chart which illustrates a method of using the medical instrument of FIG. 3.

FIG. 4 shows a flowchart which illustrates a method of operating the magnetic resonance imaging system 300 of FIG. 3. The method illustrated in FIG. 4 is similar to the method illustrated in FIG. 2 with additional steps. The method starts with step 400 where the computational system 104 controls the magnetic resonance imaging system with the pulse sequence commands 330 to acquire the measured k-space data 332. Next, in step 402, the measured k-space data 332 is received. This may for example be retrieved from the memory 110. The measured k-space data may have a spiral sampling pattern or a non-Cartesian sampling pattern in some examples. Next, in step 404, the single magnetic resonance image 334 for each of the slices is reconstructed from the measured k-space data 332. Next, in step 406, the single magnetic resonance data for each of the slices 334 is received. This may for example entail retrieving it from the memory 110 or receiving it via a network. Next, in step 408, the set of partially deblurred magnetic resonance images 124 for each slice is calculated by using an off-resonance demodulation with a demodulation frequency set by the demodulation frequency map and the assigned demodulation frequency. Next, the method proceeds to steps 200, 202, 204, and 206 as illustrated in FIG. 2. After step 206 is performed the method then proceeds to step 410. In step 410 the corrected B0 inhomogeneity map 338 is calculated from the prior B0 inhomogeneity map 336 and the determined B0 inhomogeneity map 130 for each slice. Next, in step 412, the computational system 104 controls the magnetic resonance imaging system 302 with the pulse sequence commands 330 to acquire additional k-space data 340. Then finally, in step 414, an additional magnetic resonance image for each of the slices is reconstructed from the additional k-space data 340. During this reconstruction the corrected B0 inhomogeneity map 338 is used to correct for inhomogeneities in the B0 field.

Examples may provide an improvement on existing prototypes to perform "de-blurring" of a spiral image using a trained "artificial intelligence" (AI) neural network. In spiral or other non-Cartesian imaging, off-resonance leads to blur in the reconstructed images. It has been shown that, given a set of input images sharpened at a uniform frequency, AI can be used to produce a de-blurred image directly; however, this leads to the risk of introducing clinically-relevant artifacts. An alternative approach is to use AI to predict the off-resonance field map, or "B0 map", which can then be passed to a "traditional" deblurring algorithm to correct the blur. This approach is more stable but requires the AI network to learn a transformation from image-like to B0-like domains, which requires increases the risk of obtaining an unreliable or inaccurate prediction.

Examples use a hybrid approach that uses the advantages of both techniques while avoiding their disadvantages. An AI module (convolutional neural network 122) is first used to create a sharpened image (predetermined number of deblurred magnetic resonance images 126) as previously discussed. This is a simpler task for the AI as it does not require transformation to a new domain. The AI output and single-frequency deblurred inputs are then fed into a second algorithm that computes the "implied" B0 map. This avoids the domain transform required for producing the B0 map directly with AI, while also mitigating the risk of artifacts generated by the network. The resulting hybrid approach is thus more stable and more accurate than either previous method.

Spiral images often contain blurring due to off-resonance. This is typically corrected through use of an off-resonance (or "B0") map, which is acquired during pre-scan. However, due to eddy currents, inaccuracies in the B0 map, and/or field drift, some blurring will remain. As part of the development of spiral imaging, we are exploring methods to use AI to sharpen images beyond what can be achieved based on the measured B0 map. There is a strong need for this feature, particularly in the case of diffusion imaging, where strong eddy current effects and long readout times lead to significant residual blur.

Two implementations are described below. In the first example, the AI network produces a sharpened image as its output. In the second, the network produces a prediction for the off-resonance field, which can then be passed to a "traditional" deblurring algorithm. The advantages and disadvantages of each approach are summarized in the following table:

| AI Network Output | Advantages | Disadvantages |
|---|---|---|
| Sharpened Image | Network operates entirely in image-like domain; smaller network and/or simpler training can be used. | Network can (potentially) learn any transformation; increased risk of introducing clinically-relevant image artifacts |
| Off-Resonance Map | Blurring is removed with a physics-based model; lower risk of introducing clinically relevant image artifacts | Network must learn to transform from image-like to field-like domains; risk of lower reliability in predicted field map |

The present invention leverages the advantages of the image-sharpening method while avoiding the increased risk. Note that the risks mentioned above block the implementation in a product due to the expected reliability of the solution.

The present invention may comprise one or more of the following elements:

An AI network trained to take a set of one or more blurred input images and produce a sharpened output image.

A method to predict the off-resonance map using both the input(s) and output of the network. In the primary embodiment, this element will not use AI; however, a second AI network could potentially serve this purpose.

Figure 5:
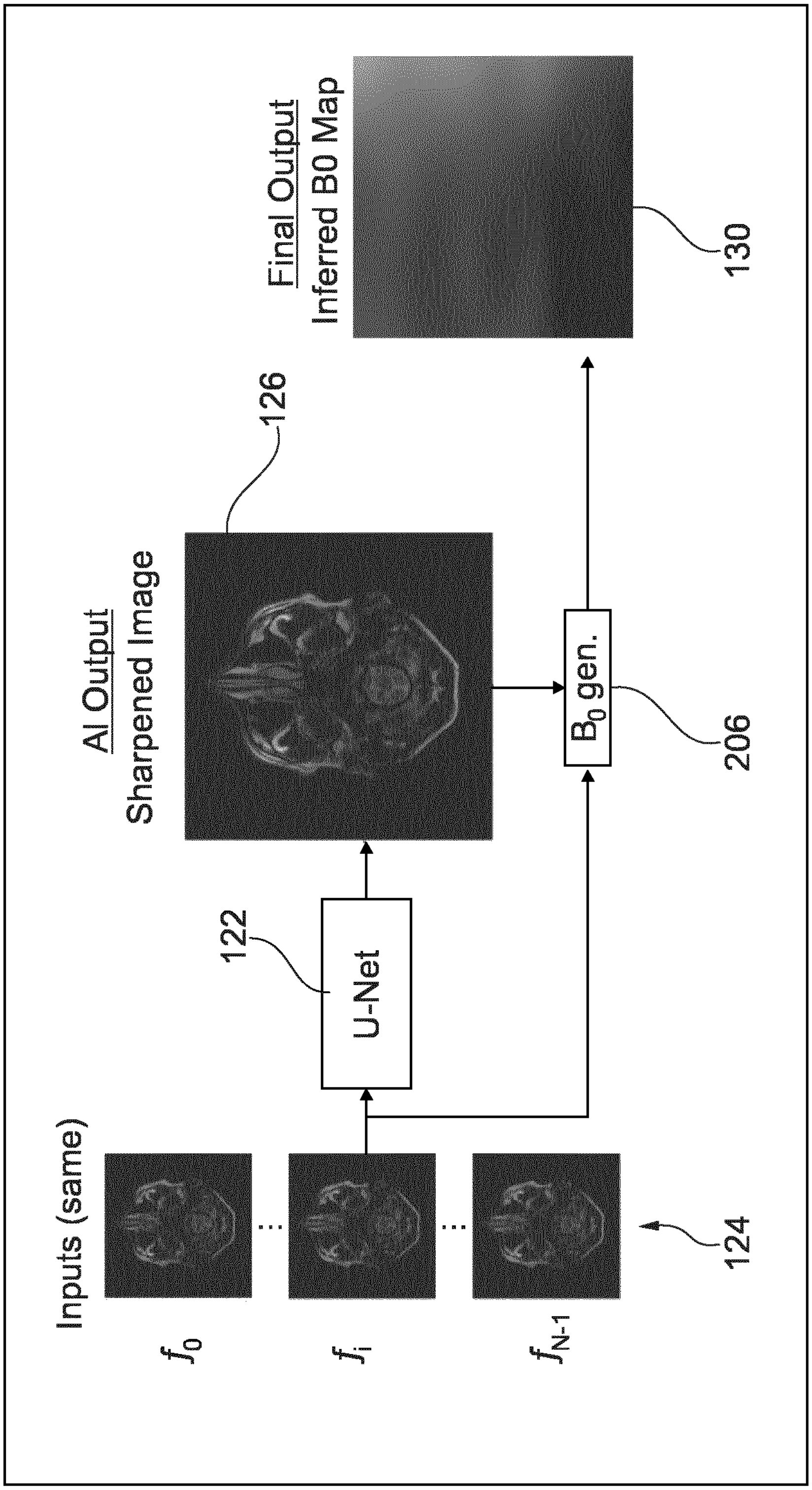
FIG. 5 illustrates the construction of a determined B0 inhomogeneity map.

FIG. 5 illustrates the construction of a determined B0 inhomogeneity map. In FIG. 5 the operations for a single slice are illustrated. Firstly, there is a set of partially deblurred magnetic resonance images 124 for this slice. These are then input into a convolutional neural network 122 which in this case is a U-net. The U-net outputs the deblurred magnetic resonance image 126. Steps 204 and 206 are then performed which then output the determined B0 inhomogeneity map 130.

The inputs to the U-Net are generated by demodulating the initial (blurred) data at a set of frequencies $f_0$ through $f_{N-1}$. The demodulation is carried out based on the known acquisition time of each point in k-space:

$$\tilde{m}_i(k_x, k_y) = m(k_x, k_y)e^{-2\pi i * f_i * t(k_x, k_y)}$$

Here m refers to the initial data and $\tilde{m}_1$ refers to the ith demodulated data set. This approach is based on the Conjugate Phase Reconstruction (CPR) algorithm. Each of the N input images will be sharp in regions where the local off-resonance is close to $f_i$. The U-Net can then be trained to produce a sharpened image from the set of partially sharpened inputs.

The second part of the invention is generation of the off-resonance map from the network inputs and output. This begins by subtracting the output from each input and taking the magnitude of the result as is illustrated in FIG. 6 below.

Figure 6:
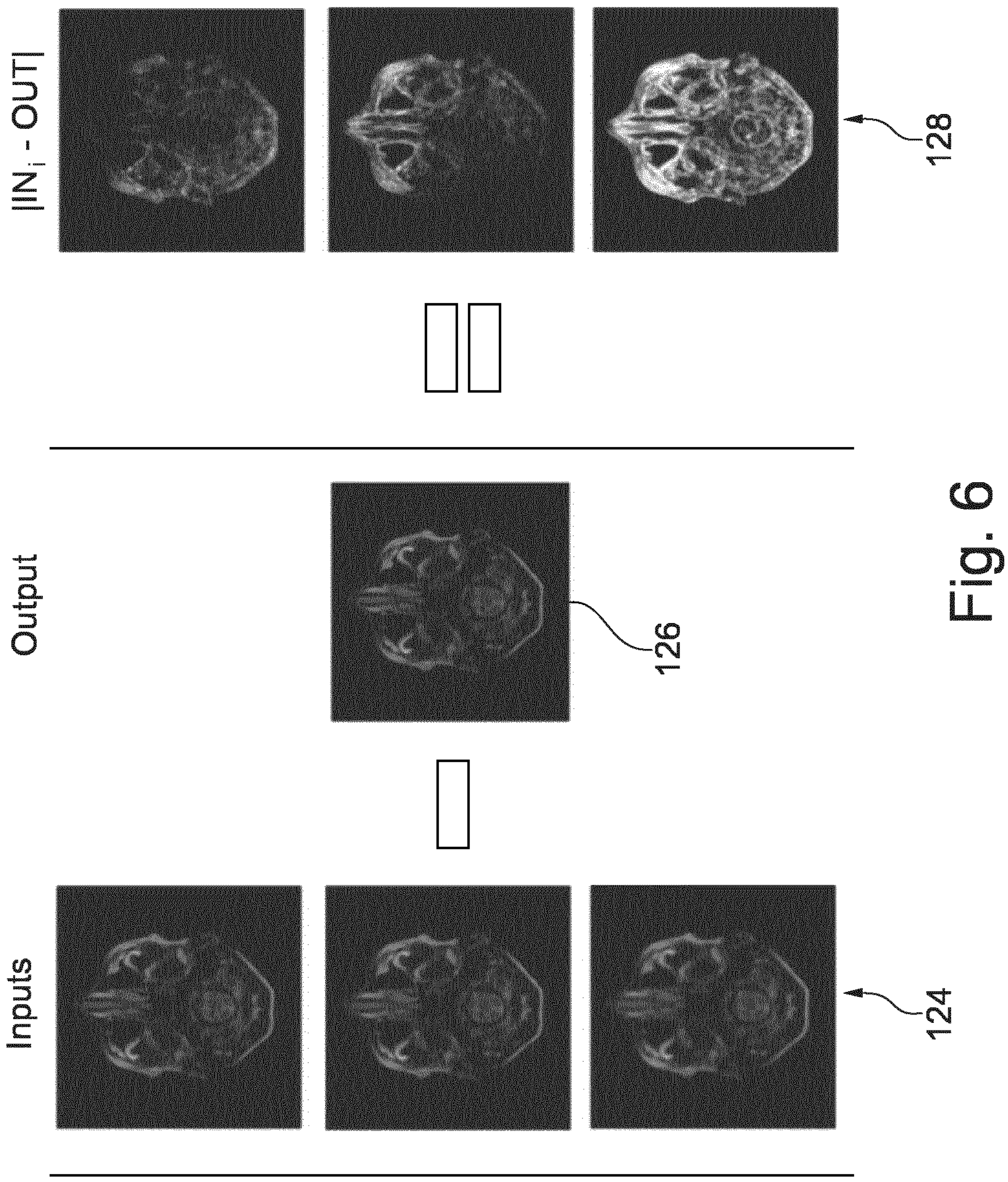
FIG. 6 illustrates the construction of the set of difference images for a single slice.

FIG. 6 illustrates the construction of the set of difference images 128 for a single slice. The partially deblurred magnetic resonance images 124 for this slice have the deblurred magnetic resonance image 126 subtracted from it. In this example the absolute value is taken, so in principle the order of the subtraction could be reversed. The result of the subtraction is then the set of difference images 128 for this particular slice. The regions of the image which are the darkest are where particular deblurred magnetic resonance image best compensates for B0 inhomogeneity.

These difference images are then fed into an algorithm to produce a smoothly-varying off-resonance map. This algorithm takes advantage of the fact that the $i^{th}$ difference image will be close to zero in regions where the off-resonance frequency is close to $f_i$. This is shown in the figure below: the upper row shows the magnitude-difference images, while the bottom row shows locations where the off-resonance map is closer to $f_i$ than any other frequency (in white).

Figure 7:
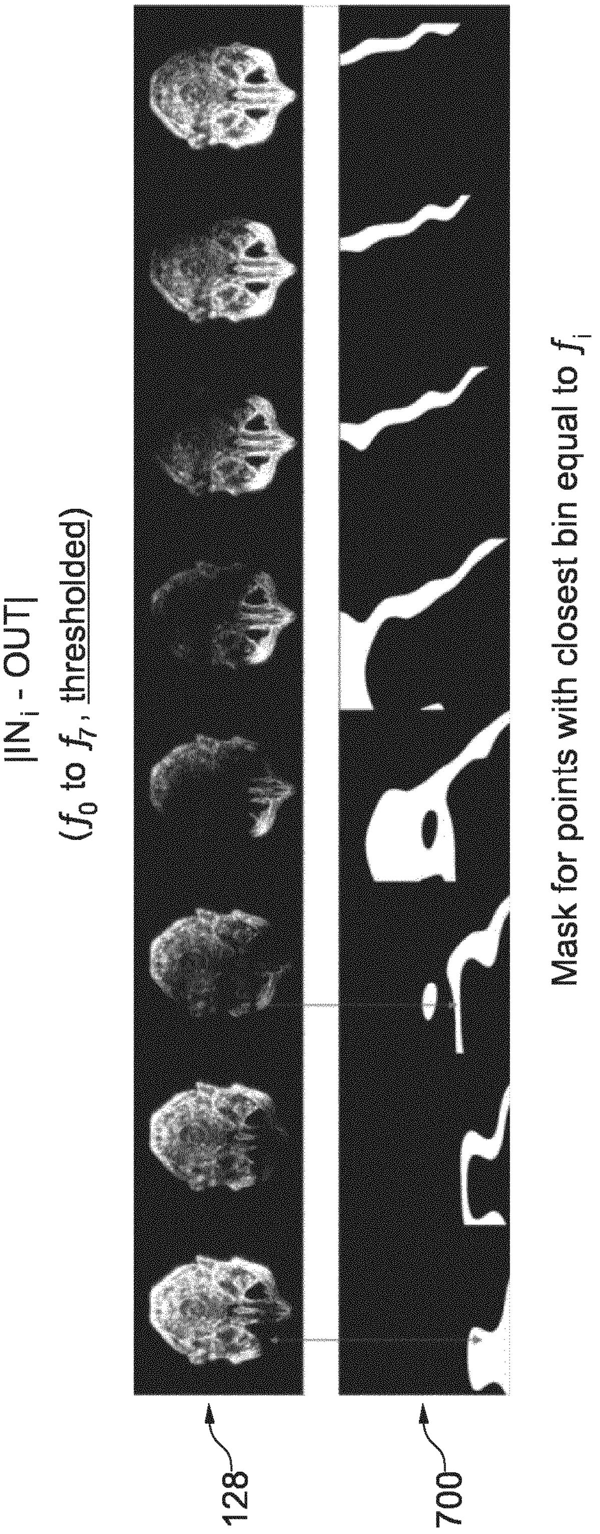
FIG. 7 illustrates one way of determining the proper off-resonance value for a particular voxel.

FIG. 7 illustrates one way of determining the proper off-resonance value for a particular voxel. In this Fig. the top row 128 shows a collection of various difference images. These difference images 128 were then used to construct the mask points with the closest bin equal to $f_i$.

Another way to view this is by looking at a row or column of magnitude-difference data "edge-on", i.e., with the $f_i$ dimension as an in-plane axis. In doing this we can see a band of values near zero. A curve shows the true off-resonance frequency for this set of pixels.

Figure 8:
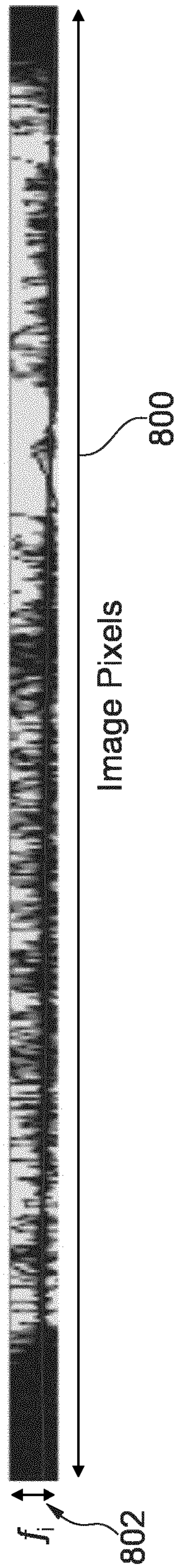
FIG. 8 shows a cross section of a row or column for a difference image.

FIG. 8 shows a cross section of a row or column for a difference image 128. The plot shows the image pixels versus the $f_i$. By searching for the pixels which are closest to zero the off-resonance value for these voxels can be determined.

to create the final B0 map, we use any algorithm that satisfies the following requirements:

Some smoothness and maximum slope are enforced on the output frequency map, f(x,y) based on the expectations of the off-resonance map.

If $i_{min}(x,y)$ is the pointwise index with the smallest $|\ln(f_i,x,y)-\text{Out}(x,y)|$, the output frequency map minimizes $|f(x,y)-f_{i_{min}(x,y)}|$.

While the primary example is based on the magnitude of the difference between the AI output and inputs, any algorithm that uses both the inputs and output, as well as a priori knowledge of the expected properties of the B0 map, could serve this purpose.

The advantage of this method is that AI is employed for a simple job—converting a set of partially sharp images into a fully sharp image—while the risk of clinically relevant artifacts arising from AI is limited by the use of a second step to infer the B0 map.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word “comprising” does not exclude other elements or steps, and the indefinite article “a” or “an” does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST

100 medical system
102 computer
104 computational system
106 hardware interface
108 user interface
110 memory
120 machine executable instructions
122 convolutional neural network
124 set of partially deblurred magnetic resonance images for each slice
126 predetermined number of deblurred magnetic resonance images
128 set of difference images for each of the slices
130 determined B0 inhomogeneity map for each slice
200 receive the set of partially deblurred magnetic resonance images for each of the slices
202 receive the predetermined number of deblurred magnetic resonance images in response to inputting the set of partially deblurred magnetic resonance images for each of the slices into the convolutional neural network
204 calculate a set of difference images for each of the slices by calculating a difference between the deblurred magnetic resonance image and each of the set of partially deblurred magnetic resonance images
206 calculate a determined B0 inhomogeneity map for each of the slices by fitting a smooth manifold to values determined from the set of difference images, the demodulation frequency map, and the assigned demodulating frequency for each of the set of difference images
300 medical system
302 magnetic resonance imaging system
304 magnet
306 bore of magnet
308 imaging zone
309 field of view
310 magnetic field gradient coils
312 magnetic field gradient coil power supply
314 radio-frequency coil
316 transceiver
318 subject
320 subject support
330 pulse sequence commands
332 measured k-space data
334 single magnetic resonance image for each of the slices
336 prior B0 inhomogeneity map
338 corrected B0 inhomogeneity map
340 additional k-space data
342 additional magnetic resonance image for each of the slices
400 acquire the measured k-space data by controlling the magnetic resonance imaging system with the pulse sequence commands
402 receive measured k-space data
404 reconstruct the single magnetic resonance image for each of the slices from the measured k-space data
406 receive a single magnetic resonance image for each of the slices
408 calculate the set of partially deblurred magnetic resonance images by applying an off-resonance demodulation with a demodulating frequency set by the demodulation frequency map and the assigned demodulating frequency
410 calculate a corrected B0 inhomogeneity map by modifying the prior B0 inhomogeneity map with the determined B0 inhomogeneity map
412 acquire additional k-space data by controlling the magnetic resonance imaging system with the pulse sequence commands
414 reconstruct an additional magnetic resonance image for each slice using the additional k-space data, wherein the reconstruction of the additional magnetic resonance image is corrected using the corrected B0 inhomogeneity map
700 mask points for closest bin equal to $f_i$

The invention claimed is:

1. A medical system comprising:

a memory configured to store machine executable instructions and a convolutional neural network configured to output a predetermined number of deblurred magnetic resonance images that are slices of a deblurred magnetic resonance imaging data set in response to receiving a set of partially deblurred magnetic resonance images for each of the slices; and a computational system, wherein execution of the machine executable instructions causes the computational system to:

receive the set of partially deblurred magnetic resonance images for each of the slices, wherein each of the set of partially deblurred magnetic resonance images has an assigned demodulating frequency specifying an offset of a slice specific demodulation frequency map;

receive the predetermined number of deblurred magnetic resonance images in response to inputting the set of partially deblurred magnetic resonance images for each of the slices into the convolutional neural network;

calculate a set of difference images for each of the slices by calculating a difference between the deblurred magnetic resonance image and each of the set of partially deblurred magnetic resonance images; and calculate a determined B0 inhomogeneity map for each of the slices by fitting a smooth manifold to values determined from the set of difference images, the demodulation frequency map, and the assigned demodulating frequency for each of the set of difference images.

2. The medical system of claim 1, wherein execution of the machine executable instructions further causes the computational system to determine a demodulating frequency for each voxel of the deblurred magnetic resonance image for each of the slices using the set of partially deblurred magnetic resonance images, the assigned demodulating frequency for each of the set of difference images, and the demodulation frequency map; and wherein the B0 inhomogeneity values are determined from the demodulation frequency for each voxel.

3. The medical system of claim 1, wherein voxels of the deblurred magnetic resonance image having a magnitude below a predetermined magnitude or a magnitude below a predetermined tolerance within at least a continuous predetermined volume are ignored or deemphasized during the fitting of the smooth manifold.

4. The medical system of claim 1, wherein execution of the machine executable instructions further causes the computational system to:

receive a single magnetic resonance image for each of the slices;

calculate the set of partially deblurred magnetic resonance images by applying an off-resonance demodulation with a demodulating frequency set by the demodulation frequency map and the assigned demodulating frequency.

5. The medical system of claim 4, wherein execution of the machine executable instructions further causes the computational system to:

receive measured k-space data, wherein the measured k-space data has a spiral sampling pattern or a non-Cartesian sampling pattern; and reconstruct the single magnetic resonance image for each of the slices from the measured k-space data.

6. The medical system of claim 5, wherein the medical system further comprises a magnetic resonance imaging system, wherein the memory further contains pulse sequence commands configured to control the magnetic resonance imaging system to acquire the measured k-space data according to a magnetic resonance imaging protocol, wherein execution of the machine executable instructions further causes the computational system to acquire the measured k-space data by controlling the magnetic resonance imaging system with the pulse sequence commands.

7. The medical system of claim 5, wherein the single magnetic resonance image for each slice is further reconstructed using a prior BO inhomogeneity map, and wherein execution of the machine executable instructions further causes the computational system to calculate a corrected B0 inhomogeneity map by modifying the prior B0 inhomogeneity map with the determined BO inhomogeneity map.

8. The medical system of claim 7, wherein execution of the machine executable instructions further causes the computational system to calculate a corrected magnetic resonance image using the measured k-space data and the corrected BO inhomogeneity map.

9. The medical system of claim 8, wherein execution of the machine executable instructions further causes the computational system to:

acquire additional k-space data by controlling the magnetic resonance imaging system with the pulse sequence commands; and reconstruct an additional magnetic resonance image for each slice using the additional k-space data, wherein the reconstruction of the additional magnetic resonance image is corrected using the corrected B0 inhomogeneity map.

10. The medical system of claim 1, wherein execution of the machine executable instructions further causes the computational system to:

determine a spatially varying demodulating frequency using the determined B0 inhomogeneity map; and calculate a corrected magnetic resonance image for each slice by demodulating the single magnetic resonance image with an off-resonance frequency demodulation that uses the spatially varying demodulating frequency.

11. The medical system of claim 9, wherein the corrected magnetic resonance image for each slice is any one of the following: a motion corrected magnetic resonance image, a cyclical cardiac magnetic resonance image, a breathing phase resolved magnetic resonance image, a diffusion weighted magnetic resonance image, a diffusion tensor weighted magnetic resonance image, an arterial spin labeled magnetic resonance image.

12. The medical system of claim 1, wherein the predetermined number of deblurred magnetic resonance images is one.

13. The medical system of claim 1, wherein the demodulation frequency map has a constant value.

14. A non-transitory computer program product comprising machine executable instructions for execution by a computational system controlling a medical system, wherein execution of the machine executable instructions causes the computational system to:

receive a set of partially deblurred magnetic resonance images for each slice of multiple slices, wherein each of the set of partially deblurred magnetic resonance images has an assigned demodulating frequency specifying an offset of a slice specific demodulation frequency map;

receive a predetermined number of deblurred magnetic resonance images in response to inputting the set of partially deblurred magnetic resonance images for each of the slices into a convolutional neural network, wherein the convolutional neural network is configured for outputting the predetermined number of deblurred magnetic resonance images that are slices of a deblurred magnetic resonance imaging data set in response to receiving the set of partially deblurred magnetic resonance images for each of the slices;

calculate a set of difference images for each of the slices by calculating a difference between the deblurred magnetic resonance image and each of the set of partially deblurred magnetic resonance images; and calculate a determined B0 inhomogeneity map for each of the slices by fitting a smooth manifold to values determined from the set of difference images, the demodulation frequency map, and the assigned demodulating frequency for each of the set of difference images.

15. A method of medical imaging, wherein the method comprises:

receiving a set of partially deblurred magnetic resonance images for each slice of one or more slices, wherein each of the set of partially deblurred magnetic resonance images has an assigned demodulating frequency specifying an offset of a slice specific demodulation frequency map;

receiving a predetermined number of deblurred magnetic resonance images in response to inputting the set of partially deblurred magnetic resonance images for each of the slices into a convolutional neural network, wherein the convolutional neural network is configured for outputting the predetermined number of deblurred magnetic resonance images that are slices of a deblurred magnetic resonance imaging data set in response to receiving the set of partially deblurred magnetic resonance images for each of the slices;

calculating a set of difference images for each of the slices by calculating a difference between the deblurred magnetic resonance image and each of the set of partially deblurred magnetic resonance images; and calculating a determined B0 inhomogeneity map for each of the slices by fitting a smooth manifold to values determined from the set of difference images, the demodulation frequency map, and the assigned demodulating frequency for each of the set of difference images.

* * * * *